(12) United States Patent
Flynn et al.

(10) Patent No.: US 10,800,649 B2
(45) Date of Patent: Oct. 13, 2020

(54) PLANAR PROCESSING OF SUSPENDED MICROELECTROMECHANICAL SYSTEMS (MEMS) DEVICES

(71) Applicant: Analog Devices International Unlimited Company, Limerick (IE)

(72) Inventors: Michael John Flynn, Waterford (IE); Paul Lambkin, Carrigaline (IE); Seamus Paul Whiston, Limerick (IE); Christina B. McLoughlin, Crecora (IE); Kotlanka Rama Krishna, Belmont, MA (US); Lynn Khine, Singapore (SG)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 15/362,296

(22) Filed: Nov. 28, 2016

(65) Prior Publication Data

US 2018/0148318 A1   May 31, 2018

(51) Int. Cl.
  *B81B 7/00*   (2006.01)
  *B81C 1/00*   (2006.01)
(52) U.S. Cl.
  CPC .......... *B81B 7/0019* (2013.01); *B81C 1/0069* (2013.01); *B81C 1/00182* (2013.01);
  (Continued)
(58) Field of Classification Search
  CPC ............ G06F 17/5068; G06F 17/5072; H01H 1/0036; H01H 1/00; H01H 59/0009;
  (Continued)

(56) References Cited

U.S. PATENT DOCUMENTS 3,916,348 A   10/1975   Toda et al.
4,384,409 A   5/1983    Lao
(Continued)

FOREIGN PATENT DOCUMENTS

DE   10 2006 022 805 A1   11/2007
JP   59-064908            4/1984
(Continued)

OTHER PUBLICATIONS

Humad et al., High frequency micromechanical piezo-on-silicon block resonators. International Electron Devices Meeting 2003IEDM. Technical Digest, Washington, D.C. Dec. 8-10, 2003. Dec 8, 2003;957-60. 4 pages.

(Continued)

*Primary Examiner* — Dale E Page
*Assistant Examiner* — Quovaunda Jefferson
(74) *Attorney, Agent, or Firm* — Wolf, Greenfield & Sacks, P.C.

(57) ABSTRACT

Suspended microelectromechanical systems (MEMS) devices including a stack of one or more materials over a cavity in a substrate are described. The suspended MEMS device may be formed by forming the stack, which may include one or more electrode layers and an active layer, over the substrate and removing part of the substrate underneath the stack to form the cavity. The resulting suspended MEMS device may include one or more channels that extend from a surface of the device to the cavity and the one or more channels have sidewalls with a spacer material. The cavity may have rounded corners and may extend beyond the one or more channels to form one or more undercut regions. The manner of fabrication may allow for forming the stack layers with a high degree of planarity.

20 Claims, 9 Drawing Sheets

(52) U.S. Cl.
CPC .. *B81C 1/00801* (2013.01); *B81B 2201/0271* (2013.01); *B81B 2203/0315* (2013.01)

(58) Field of Classification Search
CPC .... H01L 41/1136; Y10T 29/42; Y10T 29/435; Y10T 29/49002; Y10T 29/4913; Y10T 29/49105; Y10T 29/49121; Y10T 29/49126; Y10T 29/49155; Y10T 29/531; Y10T 29/5313; B81B 3/0072; B81B 3/0021; B81C 1/0015; B81C 1/00365; B81C 1/00476; B81C 1/00619; B81C 1/00626; B81C 1/00666
See application file for complete search history.

(56) References Cited

U.S. PATENT DOCUMENTS

| | | | |
|---|---|---|---|
| 4,449,107 A | 5/1984 | Asai et al. | |
| 4,454,440 A | 6/1984 | Cullen | |
| 4,516,049 A | 5/1985 | Mikoshiba et al. | |
| 4,647,881 A | 3/1987 | Mitsutsuka | |
| 5,129,262 A | 7/1992 | White et al. | |
| 5,597,759 A * | 1/1997 | Yoshimori | H01L 21/8221 257/E21.614 |
| 5,786,235 A | 7/1998 | Eisele et al. | |
| 5,914,553 A | 6/1999 | Adams et al. | |
| 5,939,956 A | 8/1999 | Arimura et al. | |
| 6,124,765 A | 9/2000 | Chan et al. | |
| 6,150,748 A | 11/2000 | Fukiharu | |
| 6,420,816 B2 | 7/2002 | Getman et al. | |
| 6,465,355 B1 | 10/2002 | Horsley | |
| 6,516,665 B1 | 2/2003 | Varadan et al. | |
| 6,556,103 B2 | 4/2003 | Shibata et al. | |
| 6,544,787 B1 | 5/2003 | Tsukahara et al. | |
| 6,566,787 B2 | 5/2003 | Tsukahara et al. | |
| 6,739,190 B2 | 5/2004 | Hsu et al. | |
| 6,828,713 B2 | 12/2004 | Bradley et al. | |
| 6,848,295 B2 | 2/2005 | Auner et al. | |
| 6,909,221 B2 | 6/2005 | Ayazi et al. | |
| 6,943,484 B2 | 9/2005 | Clark et al. | |
| 6,954,020 B2 | 10/2005 | Ma et al. | |
| 6,987,432 B2 | 1/2006 | Lutz et al. | |
| 6,995,622 B2 | 2/2006 | Partridge et al. | |
| 7,005,946 B2 | 2/2006 | Duwel et al. | |
| 7,068,125 B2 | 6/2006 | Lutz et al. | |
| 7,083,997 B2 | 8/2006 | Brosnihhan et al. | |
| 7,102,467 B2 | 9/2006 | Lutz et al. | |
| 7,211,926 B2 | 5/2007 | Quevy et al. | |
| 7,215,061 B2 | 5/2007 | Kihara et al. | |
| 7,250,322 B2 | 7/2007 | Christenson et al. | |
| 7,352,608 B2 | 4/2008 | Mohanty et al. | |
| 7,471,028 B2 | 12/2008 | Onozawa | |
| 7,492,241 B2 | 2/2009 | Piazza et al. | |
| 7,504,909 B2 | 3/2009 | Tada | |
| 7,535,152 B2 | 5/2009 | Ogami et al. | |
| 7,602,099 B2 | 10/2009 | Fujimoto et al. | |
| 7,724,103 B2 | 5/2010 | Feng et al. | |
| 7,728,483 B2 | 6/2010 | Tanaka | |
| 7,791,432 B2 | 9/2010 | Piazza et al. | |
| 8,035,277 B2 | 10/2011 | Barber et al. | |
| 8,058,769 B2 | 11/2011 | Chen et al. | |
| 8,298,847 B2 | 10/2012 | Kogut et al. | |
| 8,319,312 B2 | 11/2012 | Morris, III et al. | |
| 8,362,675 B2 | 1/2013 | Chen et al. | |
| 8,492,855 B2 | 7/2013 | Lammel et al. | |
| 8,629,599 B2 | 1/2014 | Chen et al. | |
| 8,937,425 B2 | 1/2015 | Chen et al. | |
| 9,511,994 B2 | 12/2016 | Tsai et al. | |
| 10,227,233 B2 | 3/2019 | Allegato et al. | |
| 2002/0001871 A1 | 1/2002 | Cho et al. | |
| 2002/0075100 A1 | 6/2002 | Katohno | |
| 2003/0060051 A1 | 3/2003 | Kretschmann et al. | |
| 2003/0148620 A1 * | 8/2003 | Chavan | B81B 3/0072 438/706 |
| 2004/0065940 A1 | 4/2004 | Ayazi et al. | |
| 2004/0195096 A1 | 10/2004 | Tsamis et al. | |
| 2005/0073078 A1 | 4/2005 | Lutz et al. | |
| 2005/0151600 A1 | 7/2005 | Takeuchi et al. | |
| 2006/0279175 A1 | 12/2006 | Aigner | |
| 2007/0052324 A1 | 3/2007 | Chen et al. | |
| 2007/0222336 A1 | 9/2007 | Grannen et al. | |
| 2007/0224720 A1 | 9/2007 | Lee et al. | |
| 2008/0010690 A1 | 1/2008 | Delapierre | |
| 2008/0048804 A1 | 2/2008 | Volatier et al. | |
| 2008/0143217 A1 | 6/2008 | Ho et al. | |
| 2008/0186109 A1 | 8/2008 | Ho et al. | |
| 2008/0204153 A1 | 8/2008 | Yoshida et al. | |
| 2008/0272852 A1 | 11/2008 | Six | |
| 2008/0284286 A1 | 11/2008 | Ogawa et al. | |
| 2008/0297281 A1 | 12/2008 | Ayazi et al. | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0243747 A1 | 10/2009 | Gaidarzhy et al. | |
| 2009/0294638 A1 | 12/2009 | Mohanty et al. | |
| 2010/0007443 A1 | 1/2010 | Mohanty et al. | |
| 2010/0026136 A1 | 2/2010 | Gaidarzhy et al. | |
| 2010/0038991 A1 | 2/2010 | Shih et al. | |
| 2010/0134207 A1 | 6/2010 | Mohanty et al. | |
| 2010/0155883 A1 | 6/2010 | Wenzler et al. | |
| 2010/0181868 A1 | 7/2010 | Gaidarzhy et al. | |
| 2010/0319185 A1 | 12/2010 | Ayazi et al. | |
| 2010/0327701 A1 | 12/2010 | Grannen et al. | |
| 2012/0049965 A1 | 3/2012 | Chen et al. | |
| 2012/0049980 A1 | 3/2012 | Chen et al. | |
| 2012/0068277 A1 | 3/2012 | Kautzsch et al. | |
| 2012/0074810 A1 | 3/2012 | Chen et al. | |
| 2013/0069177 A1 | 3/2013 | Wang et al. | |
| 2013/0096825 A1 * | 4/2013 | Mohanty | G01C 21/165 701/472 |
| 2013/0122627 A1 * | 5/2013 | Harame | H01L 21/84 438/50 |
| 2014/0306580 A1 | 10/2014 | Thalmayr | |
| 2015/0091412 A1 | 4/2015 | Chen et al. | |
| 2015/0298965 A1 * | 10/2015 | Tsai | B81C 1/00182 257/415 |
| 2018/0134543 A1 | 5/2018 | Kuang et al. | |

FOREIGN PATENT DOCUMENTS

| | | |
|---|---|---|
| JP | 02-007525 | 2/1990 |
| JP | 10-209801 | 8/1998 |
| JP | 2005-142902 | 6/2005 |
| JP | 2006-042116 | 2/2006 |
| JP | 2006-190797 A | 7/2006 |
| JP | 2006-286711 A | 10/2006 |
| JP | 2006-339941 A | 12/2006 |
| JP | 2008-098974 | 4/2008 |
| JP | 2008-258884 | 10/2008 |
| WO | WO 98/01948 A1 | 1/1998 |
| WO | WO 02/17481 A2 | 2/2002 |
| WO | WO 2004/095696 A2 | 11/2004 |
| WO | WO 2006/000611 A1 | 1/2006 |
| WO | WO 2006/083482 A2 | 8/2006 |
| WO | WO 2007/072408 A2 | 6/2007 |
| WO | WO 2007/072409 A2 | 6/2007 |
| WO | WO 2007/143520 A2 | 12/2007 |
| WO | WO 2010/011288 A1 | 1/2010 |

OTHER PUBLICATIONS

Kuypers et al., Intrinsic temperature compensation of aluminum nitride Lamb wave resonators for multiple-frequency references. Frequency Control Symposium. 2008 IEEE International. 2008;240-9.

Lakin et al., Temperature compensated bulk acoustic thin film resonators. Proceedings of IEEE Ultrasonics Symposium. 2000;1:855-8.

Piazza et al., Low motional resistance ring-shaped contour-mode aluminum nitride piezoelectric micromechanical resonators for UHF applications. Micro Electro Mechanical Systems. 18th IEEE Inter-

(56) References Cited

OTHER PUBLICATIONS national Conference, Miami Beach, Florida, Jan. 30-Feb. 3, 2005. Jan. 30, 2005;20-3.

Spriggs et al., Mechanical Properties of Pure, Dense Aluminum Oxide as a Function of Temperature and Grain Size. J Amer Ceramic Soc. Jul. 1964; 47(7):323-7.

Tirole et al., Lamb Waves Pressure Sensor Using an A N/Si Structure. Proceedings of Ultrasonics Symposium, Oct. 31, 1993-Nov. 3, 1993, Baltimore, MD. 1993;1: 371-4.

Yu et al., Ultra Temperature-Stable Bulk-Acoustic-Wave Resonators with Si0 2 Compensation Layer. IEEE Trans Ultrason Ferroelectr Freq Contr. 2007; 54(10):2102-9.

International Search Report and Written Opinion dated Feb. 22, 2018 in connection with International Application No. PCT/IB2017/001552.

Benecke et al., MEMS Applications of Porous Silicon, Institute for Microsensors, -actuators and -systems (IMSAS), 2001, 12 pages, available at: https://pdfs.semanticscholar.org/d7be/0d86c72b3372ca5ec16fc8bdac30ab0a5855.pdf.

Yasaitis et al., A modular process for integrating thick polysilicon MEMS devices with sub-micron CMOS, Proceedings of SPIE, Jan. 2003, vol. 4979, pp. 145-154.

\* cited by examiner

PLANAR PROCESSING OF SUSPENDED MICROELECTROMECHANICAL SYSTEMS (MEMS) DEVICES

FIELD OF THE DISCLOSURE

The present application relates to suspended microelectromechanical systems (MEMS) devices and methods for fabricating such devices.

BACKGROUND

Some microelectromechanical systems (MEMS) devices include a structure suspended over a cavity. For instance, some MEMS resonators include a stack of layers suspended by tethers above a cavity in a substrate. One layer of the stack is sometimes a bottom electrode, another layer is sometimes a top electrode, and a piezoelectric material is between the bottom and top electrodes. MEMS resonators may vibrate at a desired frequency and may be used in frequency and timing applications, including time and clock applications, signal filtering, and motion sensing.

SUMMARY OF THE DISCLOSURE

Suspended microelectromechanical systems (MEMS) devices including a stack of one or more materials over a cavity in a substrate are described. The suspended MEMS device may be formed by forming the stack, which may include one or more electrode layers and an active layer, over the substrate and removing part of the substrate underneath the stack to form the cavity. The resulting suspended MEMS device may include one or more channels that extend from a surface of the device to the cavity and the one or more channels have sidewalls with a spacer material. The cavity may have rounded corners and may extend beyond the one or more channels to form one or more undercut regions. The manner of fabrication may allow for forming the stack layers with a high degree of planarity.

According to an aspect of the present application, a microelectromechanical systems (MEMS) device is provided. The MEMS device comprises a bottom electrode positioned over a cavity of a silicon substrate, a top electrode, an active layer positioned between the bottom electrode and the top electrode, and at least one channel extending from a surface of the microelectromechanical device to the cavity. One or more sidewalls of the at least one channel include a spacer.

According to an aspect of the present application, a method for forming a microelectromechanical systems (MEMS) device is provided. The method comprises forming a bottom electrode by forming an electrode layer and an active layer over a silicon substrate and patterning the electrode layer and the active layer. The method further comprises forming a top electrode over the bottom electrode and the patterned active layer. The patterned active layer is positioned between the bottom electrode and the top electrode. The method further comprises forming a cavity in the silicon substrate by forming at least one channel that extends from a surface to the silicon substrate and removing at least a portion of the silicon substrate from under the bottom electrode.

According to an aspect of the present application, a method for forming a microelectromechanical systems (MEMS) device is provided. The method comprises forming a bottom electrode, an active layer, and a top electrode of the MEMS device over a silicon substrate. The method further comprises forming at least one channel that extends to the silicon substrate, forming a layer of spacer material on a surface of the at least one channel, and forming a cavity underneath the bottom electrode by removing a portion of the silicon substrate.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
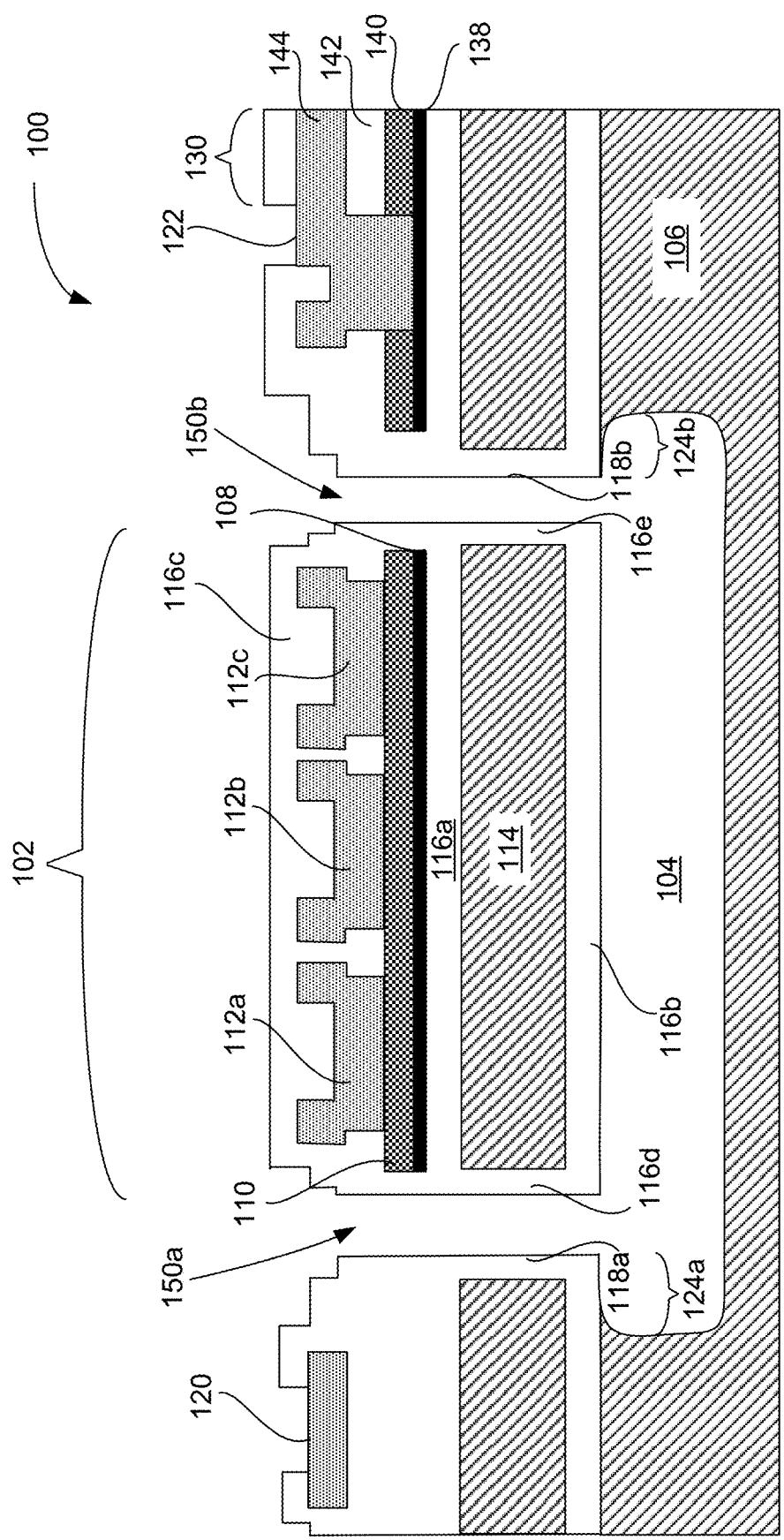
FIG. 1 is a cross-sectional view of a microelectromechanical systems device having a suspended resonator structure.

Aspects of the present application relate to suspended microelectromechanical systems (MEMS) structures, such as MEMS resonators, and to fabrication techniques for making such structures. In some embodiments, the features of the MEMS resonator are largely defined or formed prior to forming the cavity above which the resonator will be suspended. This differs from forming the cavity prior to defining the features of the resonator. Defining the features of the resonator prior to cavity formation may allow for the features to be formed on layers that are more planar than they would be if formed after the cavity. Pre-forming the cavity can create a non-planar surface topology upon which subsequent layers are formed, and this may lead to defects in the subsequently defined features which in turn negatively impact the device performance. Thus, defining the features of the MEMS resonator prior to cavity formation may result in higher performance devices. Such a process may be described as forming the cavity post (after) formation of the resonator stack of layers (referred to as the "resonator stack" for short).

Some aspects of the present application relate to the manner in which the active layer and electrode materials of the MEMS resonator are formed. In some embodiments, the resonator stack may include a bottom electrode, an active layer, and a top electrode, and the bottom electrode and active layer may be formed by depositing and patterning layers of appropriate material prior to formation of the top electrode over the active layer. A cavity may subsequently be formed under the stack after formation of the top electrode. In some embodiments, an oxide layer may be formed over the top electrode and may act to provide thermal compensation to the MEMS device. In some embodiments, the resulting suspended structure may be enclosed by one or more spacer materials (e.g., oxide) in a cross-sectional plane of the MEMS device.

In addition to providing a planar structure while depositing one or more layers of the stack, the fabrication techniques according to aspects of the present application for forming a suspended MEMS structure may reduce cost since a single substrate (e.g. silicon wafer, silicon-on-insulator wafer) can be used.

Fabrication of a suspended MEMS structure by forming a cavity post stack formation may be applied to various types of suspended MEMS structures, including MEMS resonators, accelerometers, and gyroscopes, by forming and patterning different types of materials in the stack. Although much of the discussion herein refers to a suspended MEMS resonator as an example, it should be appreciated that these techniques may be suitable for formation of cavities in a substrate to suspend devices other than resonators.

A suspended MEMS structure fabricated using the techniques described herein may have one or more physical features resulting from the fabrication process. One such feature is the presence of a spacer material (e.g., oxide) on the sides of channels that extend towards the underlying cavity. To form the cavity in the substrate after defining the resonator features, channels may be formed from an upper surface of the substrate to a point deeper than the resonator. Subsequent deposition of layers on the resonator structure, such as oxide layers, may result in such layers covering the sidewalls of the channels. This may be considered a sidewall spacer material in some embodiments. The spacer material may act to reduce or prevent etching of one or more materials of the resonator stack while etching of the substrate to form the cavity.

One or more structural features of the resulting cavity may arise depending on the type of process used to remove the substrate from underneath the stack of materials. To form the cavity, an etching process that removes the substrate horizontally as well as vertically (e.g., an isotropic etch process) may be used to form the cavity after the stack of materials are formed over the substrate. Accordingly, the resulting cavity may have physical features that differ from that of a cavity formed using a vertical etching process (e.g., an anisotropic etch process). In embodiments where an isotropic etching process is used to form the cavity, the cavity may include one or more undercut regions that extend from underneath the stack. The undercut regions may have rounded corners and the curved profile of the rounded corners may depend on one or more conditions of the etching process and/or substrate material. This is contrast with cavity formed in a substrate using an anisotropic etching process, which would result in a cavity having box or square corners.

Another structural feature of a MEMS resonator according to embodiments of the present application is that the top electrode of the resonator may contact the active layer material only in the electrode regions. On the tether regions suspending the resonator body from the substrate, the top electrode material may be separated from the active layer material by a spacer layer, such as an oxide. This may prevent undesired excitation of an active layer at the tether region.

FIG. 1 shows microelectromechanical systems (MEMS) device 100 having resonator structure 102 suspended over cavity 104 of substrate 106 (e.g., silicon substrate). Cavity 104 may provide a desired distance or separation between resonator structure 102 and substrate 106. One or more channels may extend from a top surface of the MEMS device 100 to cavity 104. One or more side surfaces of a channel may include a spacer material (e.g., oxide), which may be considered as a sidewall spacer of the channel. Spacer regions 118a and 116d form surfaces of channel 150a. Spacer regions 118b and 116e form surfaces of channel 150b. Cavity 104 may include undercut regions 124a and 124b that extend beyond channels 150a and 150b, respectively. Cavity 104 may have rounded corners, as shown by the rounded corners of undercut regions 124a and 124b shown in FIG. 1.

Resonator structure 102, which may be considered as a resonator stack, may include bottom electrode 108, active layer 110, and top electrode 112. Bottom electrode 108, active layer 110, and top electrode 112 are positioned over cavity 104, and active layer 110 is positioned between bottom electrode 108 and top electrode 112. Bottom electrode 108 and/or top electrode 112 may contact active layer 110 at one or more locations. For example, top electrode 112 may have multiple regions in contact with active layer 110, shown in FIG. 1 as top electrode regions 112a, 112b, and 112c. Although only three top electrode regions are shown in FIG. 1, it should be appreciated that any suitable number of electrode regions may be implemented. Also, the top electrodes in some embodiments may be interdigitated electrodes, for example with the electrode regions 112a, 112b, and 112c representing different fingers of an interdigitated electrode. By contrast, in some embodiments the bottom electrode may be a blanket electrode. Bottom electrode 108 and top electrode 112 may include one or more metals (e.g., aluminum, titanium, copper, molybdenum). The thickness of bottom electrode 108 may be in the range of 50 nanometers to 150 nanometers, or any value or range of values in that range. The thickness of top electrode 112 may be in the range of 300 nanometers to 1 micron, or any value or range of values in that range. Active layer 110 may include one or more piezoelectric materials (e.g., aluminum nitride). The thickness of active layer 110 may be in the range of 0.2 microns to 1 micron, or any value or range of values in that range. In some embodiments, the thickness of active layer 110 may be in the range of 400 nanometers to 800 nanometers. In some embodiments, bottom electrode 108 is formed of a layer that includes titanium, active layer 110 is formed of a layer that includes aluminum nitride, and top electrode 112 is formed of a layer that includes aluminum and copper. In embodiments having other types of suspended structures, it should be appreciated that the number of layers, thickness of layers, and/or types of materials that form the suspended structure may vary according to the type of MEMS device.

Resonator structure 102 may include one or more layers of silicon 114. The one or more silicon layers 114 may provide a desired distance between one or more components of the resonator stack (e.g., bottom electrode, active layer, top electrode) from cavity 104. The thickness of the one or more silicon layers 114 may be in the range of 2 microns to 15 microns, or any value or range of values within that range. A silicon layer of region 114 of resonator structure 102 may result from fabrication of suspended MEMS device 110 using a silicon wafer. In such embodiments, a portion of a silicon layer of the wafer may form part of region 114 within resonator structure 102. In some embodiments, a silicon-on-insulator wafer is used to fabricate suspended MEMS device 110, and a layer of silicon over an insulator layer of the wafer may be a silicon layer 114 of the resonator structure 102.

In some embodiments, the one or more layers or silicon 114 may include a layer of epitaxial silicon. The epitaxial silicon layer may be formed on a silicon-on-insulator wafer using a suitable epitaxy deposition process (e.g., chemical vapor deposition). The epitaxial silicon layer may provide a desired thickness of silicon over an insulator layer (e.g., oxide layer) of the silicon-on-insulator wafer. The thickness of the layer of epitaxial silicon may be in the range of 4 microns to 15 microns, or any value or range of values in that range. In some embodiments, the epitaxial silicon layer may be formed over a silicon layer of a wafer (e.g., a silicon-on-insulator wafer). In some embodiments, the silicon layer of the wafer and the epitaxial silicon layer may form the one or more silicon layers 114 shown in suspended MEMS device 100.

Fabrication techniques of the present application may include forming a cavity in a substrate by an etching process that removes the substrate both laterally and vertically (e.g., an isotropic etch process). A cavity formed using the techniques described herein may have rounded corners as a result of lateral etching of the substrate, such as cavity 104 shown in FIG. 1. The curvature of the corners of cavity 104 may depend on one or more parameters of the etching process (e.g., etch time, etch vapor) used to form cavity 104 and/or the material of substrate 106.

Another feature of the resulting cavity is that it may extend in a lateral direction of the substrate beyond the suspended structure. In some embodiments, the cavity may extend to another region of the MEMS device, such as a region that includes a contact for an electrode of the MEMS device, forming an undercut region of the cavity. Undercut regions 124a and 124b of cavity 104 extend beyond resonator structure 102 in the cross-sectional plane of suspended MEMS device 100 shown in FIG. 1. Undercut region 124a extends beyond channel 150b to a region of MEMS device 100 that has contact 120 (e.g., bond pad). In some embodiments, contact 120 may be a contact for top electrode 112 and may be used to provide an electrical signal to top electrode 112. Undercut region 124b extends beyond channel 150b to a region of MEMS device 100 that has contact 122. Contact 122 contacts a region of bottom electrode layer 138 and may be used to provide an electrical signal to bottom electrode 108. Contact 122 may be formed by removing a portion of active layer 140, which is separated from active layer 110 of resonator structure 102 by channel 150b, and forming contact 122 in direct contact with bottom electrode layer 138. Contacts 120 and 122 may be formed of any suitable conductive materials, including metals (e.g., copper, titanium, aluminum, molybdenum). In some embodiments, a contact of a suspended MEMS device may be formed in a region that lacks an active layer and/or a conductive layer (e.g., bottom electrode layer, top electrode layer). For example, the region of suspended MEMS device 100 that includes contact 120 lacks an active layer and a layer of conductive layer, such as a conductive layer substantially similar to bottom electrode 108.

Resonator structure 102 may include one or more spacer materials (e.g., oxides). A spacer may act to isolate and/or protect a region of resonator structure 102. In some embodiments, the material used as a spacer may act to provide thermal compensation to suspended MEMS device 100. FIG. 1 shows spacer regions 116a, 116b, 116c, 116d, and 116e of suspended MEMS device 100. Spacer regions 116a, 116b, 116c, 116d, and 116e may include one or more oxides, or any other type of suitable material. In some embodiments, a layer of spacer material may be positioned between the cavity and the bottom electrode of a suspended structure. In embodiments where the suspended structure has one or more layers of silicon, a layer of spacer material may be positioned between the one or more layers of silicon and the bottom electrode. As shown in FIG. 1, layer of spacer material 116a is positioned between bottom electrode 108 and one or more layers of silicon 114. The thickness of spacer material 116a may be in the range of 0.4 microns to 1.5 microns, or any value or range of values in that range.

Layer of spacer material 116b is positioned on a surface of resonator structure 102 proximate to cavity 104. In embodiments where a silicon-on-insulator wafer is used to fabricate suspended MEMS device 100, layer of spacer material 116b may be formed of an insulator layer of the wafer.

In some embodiments, a resonator structure may be enclosed by one or more spacer materials in a cross-sectional plane of the suspended MEMS device. In the cross-sectional plane of suspended MEMS device 100 shown in FIG. 1, resonator structure 102 is enclosed by spacer material regions 116b, 116c, 116d, and 116e. Spacer region 116c is positioned over top electrode regions 112a, 112b, and 112c. In some embodiments, spacer region 116c may contact both top electrode 112 and active layer 108, as shown in FIG. 1. In some embodiments, spacer region 116c may be configured to provide thermal compensation to resonator structure 102. Spacer regions 116d and 116e positioned on the sides of resonator structure 102 may extend towards cavity 104. Spacer regions on the sides of a resonator structure may separate the resonator structure from other regions of the suspended MEMS device and may be considered as sidewall spacers to channels that extend to the underlying cavity. As shown in FIG. 1, spacer region 116d may be considered as a sidewall spacer to channel 150a which separates resonator structure 102 from region of MEMS device 100 having contact 120 and spacer region 116e may be considered as a sidewall spacer to channel 150b which separates resonator structure 102 from region of MEMS device 100 having contact 122.

Spacer material may be present on other surfaces of a channel that are separate from a suspended structure. Spacer region 118a may be formed as a surface of channel 150a opposite to spacer region 116d, and spacer region 118b may form a surface of channel 150b opposite to spacer region 116e. Spacer regions 118a and 118b may include one or more oxides, or any suitable type of material. In this manner, channels 150a and 150b extend from a surface of MEMS device 100 to cavity 104 and have one or more sidewalls having a spacer material. In some embodiments, one or more sidewalls of a channel extending from a surface of MEMS device 100 to cavity 104 may include an oxide.

A suspended MEMS device fabricated according to the techniques described herein may include a region separated by a channel from the suspended structure. Such a region may be considered as a tether region of the MEMS device. The tether region may have an active layer and a conductive layer (e.g., electrode layer) separated by a layer of spacer material (e.g., oxide). The conductive layer and the active layer may not contact in a tether region of a suspended MEMS device. In some instances, the layer of spacer material may electrically insulate the conductive layer from the active layer. This may prevent undesired excitation of the active layer. As shown in FIG. 1, suspended MEMS device 100 has tether region 130 where conductive layer 144 and active layer 140 are separated by layer of spacer material 142. Layer of spacer material 142 may include one or more oxides, or any suitable type of material. In some embodiments, fabrication of suspended MEMS device 100 may include forming active layer 140 as the same layer as active layer 108 of resonator structure 102. In some embodiments, active layer 140 may be positioned in the same plane of suspended MEMS device 100 as active layer 108. Active layer 140 may include one or more piezoelectric materials (e.g., aluminum nitride). Conductive layer 144 may include one or more metals (e.g., aluminum, copper, titanium, molybdenum). In some embodiments, formation of suspended MEMS device 100 may include forming layer of conductive material 144 as the same layer as top electrode 112. In some embodiments, layer of conductive material 144 may be in the same plane of suspended MEMS device 100 as top electrode 112.

The present application relates to fabrication techniques used for forming a suspended MEMS device, such as MEMS device 100 having resonator structure 102 shown in FIG. 1. Some embodiments relate to methods of fabricating a suspended structure in a MEMS device by forming one or more electrodes and an active layer over a substrate (e.g., silicon wafer, silicon-on-insulator wafer) and forming a cavity in the substrate under the active layer and/or the one or more electrodes. The cavity may be formed by forming at least one channel that extends to the substrate and removing at least a portion of the substrate from underneath the active layer and/or the one or more electrodes. In some embodiments, a method of forming a MEMS device may include forming a bottom electrode by forming an electrode layer and an active layer over a substrate (e.g., silicon wafer, silicon-on-insulator wafer), patterning the electrode layer and the active layer, forming a top electrode over the bottom electrode and the patterned active layer, and forming the cavity in the substrate. In some embodiments, the cavity may be formed by forming a layer of spacer material on a surface of the at least one channel and removing at least a portion of the substrate from under the bottom electrode.

Figure 2:
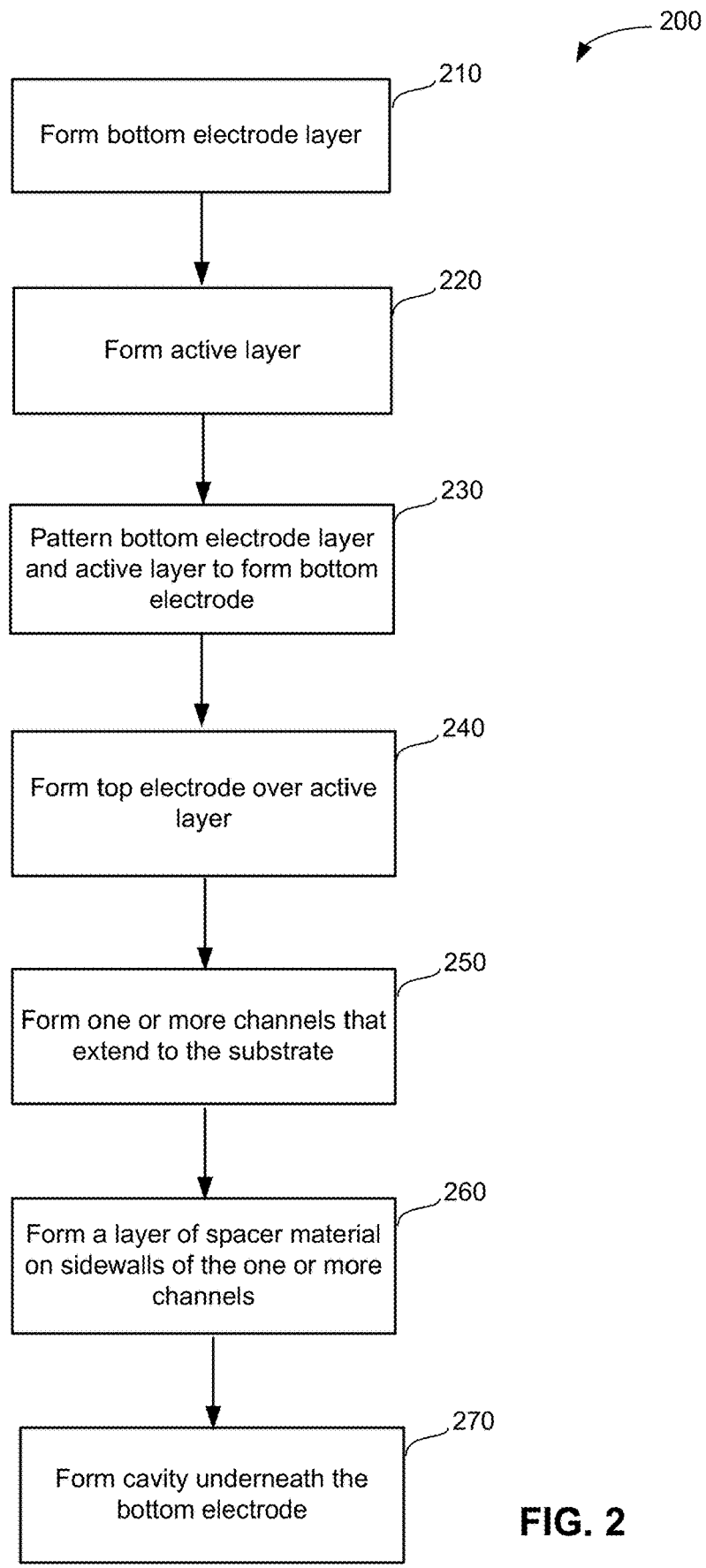
FIG. 2 is an exemplary method of manufacturing a microelectromechanical systems device of the types described herein having a suspended structure.

FIG. 2 shows an exemplary method 200 of manufacturing a MEMS device having a suspended structure. At act 210, a bottom electrode layer may be formed over a substrate. In some embodiments, the substrate is a silicon substrate. In some embodiments, the substrate is a silicon-on-insulator wafer. In some embodiments, a layer of silicon (e.g., epitaxial silicon) and/or a layer of spacer material (e.g., oxide) may be formed over the substrate and positioned between the bottom electrode layer and the substrate. At act 220, an active layer may be formed over the bottom electrode layer. The active layer may include one or more piezoelectric materials (e.g., aluminum nitride). At act 230, the bottom electrode layer and the active layer may be patterned to form a bottom electrode and a patterned active layer. In some embodiments, one or more layers of spacer material (e.g., oxide) may be formed over the active layer before patterning of the active layer and the bottom electrode layer. Patterning of the bottom electrode layer and the active layer may include using any suitable lithographic techniques.

At act 240, a top electrode may be formed over the patterned active layer. The top electrode may be formed using any suitable lithographic techniques. In some embodiments, the method may include forming one or more layers of spacer material over the bottom electrode and the patterned active layer. Formation of the one or more layers of spacer material may include planarization of the spacer material to form a planar surface. Planarization of the spacer material may reduce or remove topological features that can arise from the patterned active layer and the bottom electrode. In some embodiments, one or more layers of spacer material formed over the patterned active layer may be removed to expose regions of the patterned active layer. One or more top electrode regions may be formed in the exposed regions of the patterned active layer. In some embodiments, the method may include forming one or more contacts to a region of the bottom electrode layer. The one or more contacts may electrically couple with the bottom electrode of the resulting MEMS device and may provide and/or receive an electrical signal to the bottom electrode.

At act 250, one or more channels may be formed to extend to the underlying substrate. One or more layers of spacer material and/or silicon may be removed to expose a region of the underlying substrate as part of forming a channel. The one or more channels may separate the patterned active layer and bottom electrode from other regions of the device (e.g., bond pad region, electrode contact region). At act 260, a layer of spacer material may be formed on the sidewalls of the one or more channels. At act 270, a cavity may be formed in the underlying substrate by removing a portion of the underlying substrate from under the patterned active layer and bottom electrode. The layer of spacer material along the sidewalls of the one or more channels may act to protect one or more layers of the suspended structure during formation of a cavity in the underlying substrate. The cavity may be formed using an isotropic etch process, and the cavity may have undercut regions that extend beyond the one or more channels. The cavity may have rounded corners.

Methods of fabricating suspended MEMS devices according to the techniques described herein that implement formation of a cavity underneath a structure stack may reduce the number of process steps needed to form the resulting device in comparison to fabrication methods where the structure is formed over a pre-formed cavity. In some embodiments, the number of resist masks needed throughout the fabrication process may be 5, 6, 7, 8, or any other suitable number. This is in contrast to using a method that forms a structure over a pre-formed cavity where 18 or more resist masks can be used. By reducing the number of steps and/or materials used to fabricate a suspended MEMS device, costs and/or time may be reduced for a suspended MEMS device fabricated using cavity formation post stack formation in comparison to methods that include formation of a suspended structure by forming the structure over a pre-formed cavity.

Figure 3A:
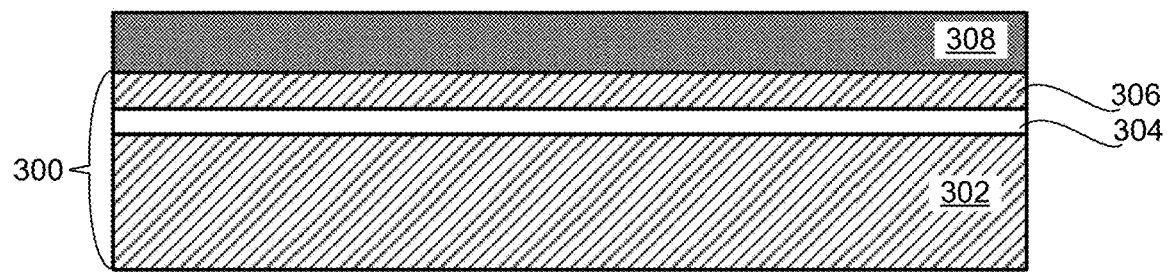
FIGS. 3A-3Q are cross-sectional views of an exemplary method of manufacturing a microelectromechanical systems device of the types described herein.
Figure 3B:
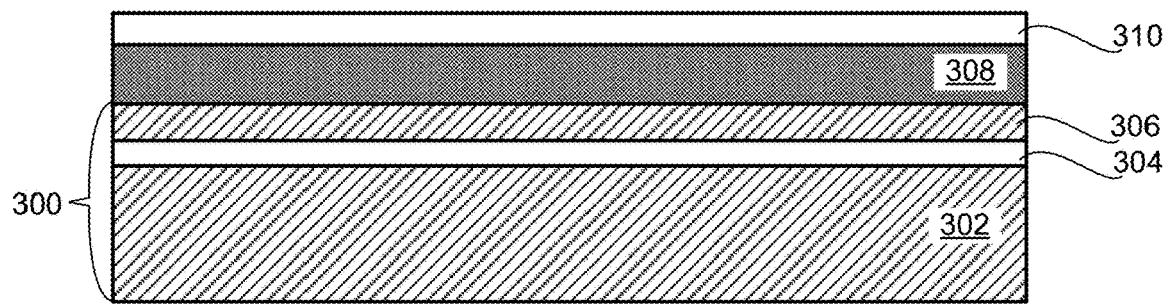
Figure 3C:
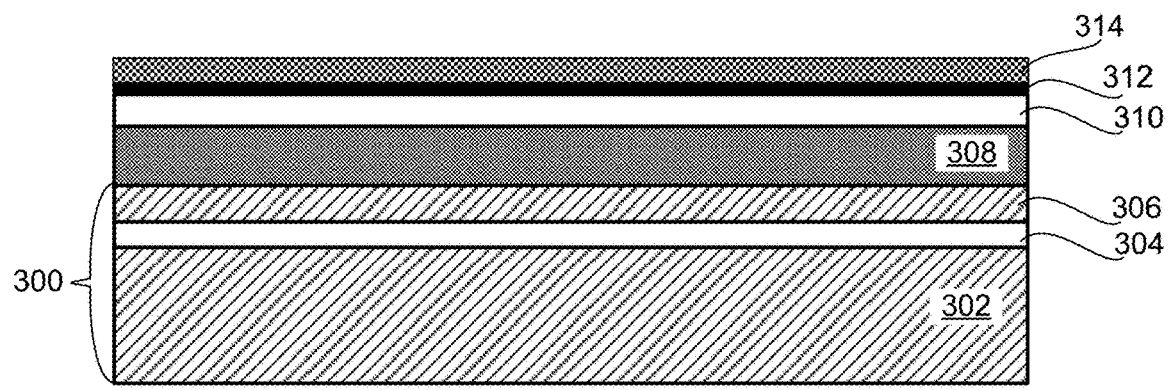
Figure 3D:
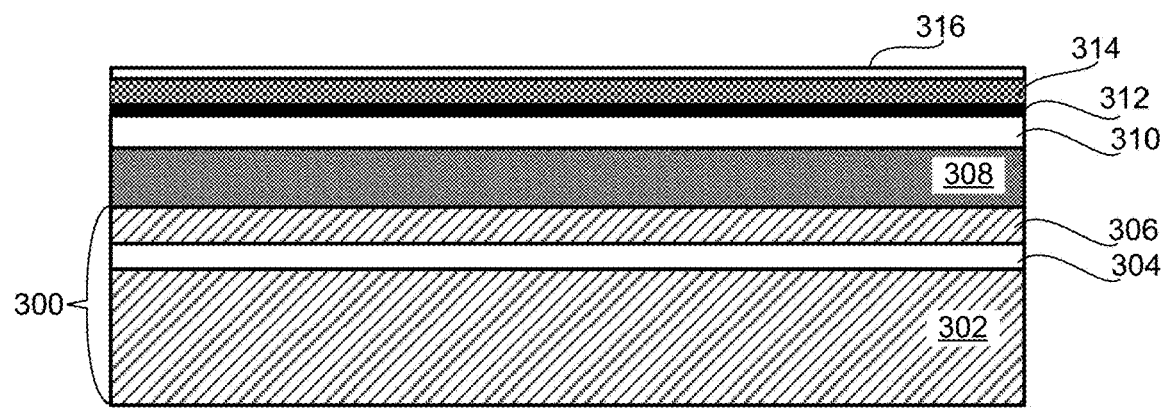
Figure 3E:
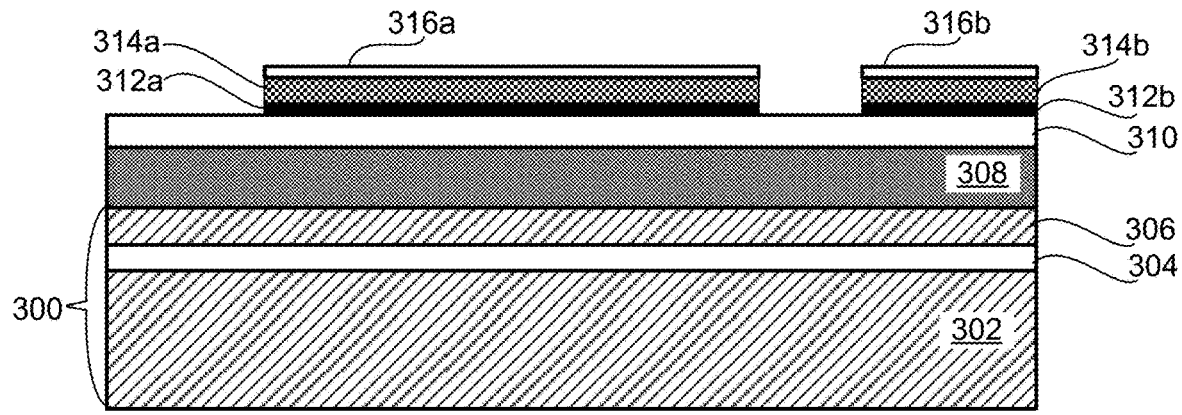
Figure 3F:
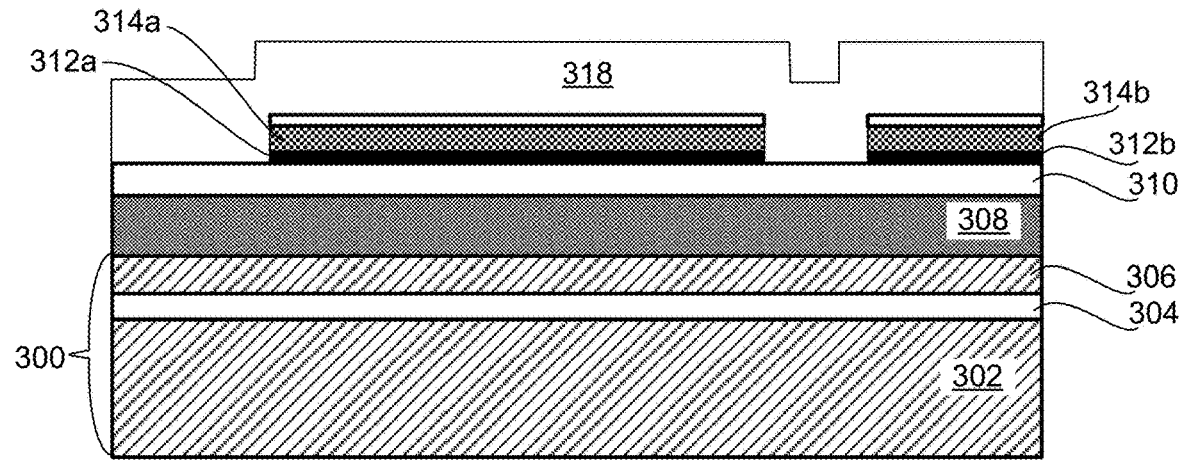
Figure 3G:
Figure 3H:
Figure 3I:
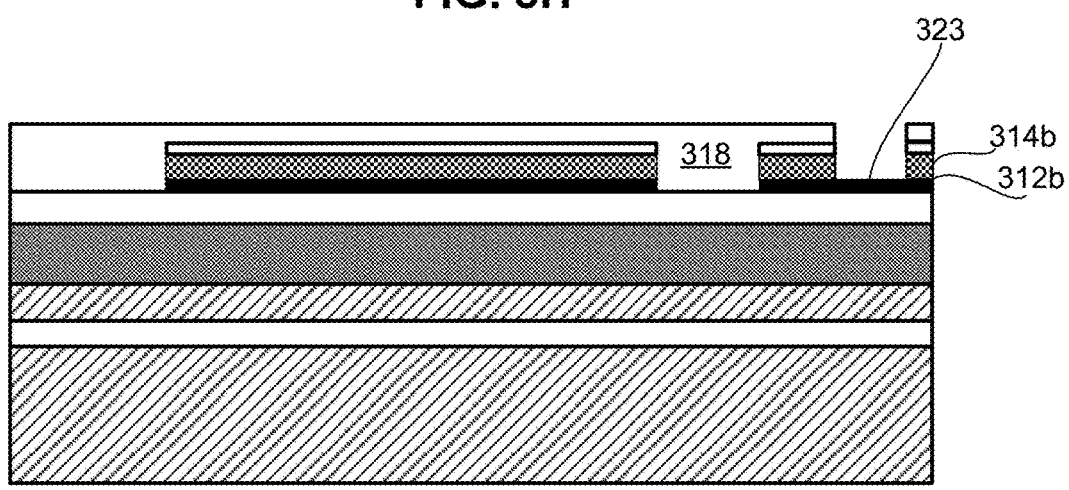
Figure 3J:
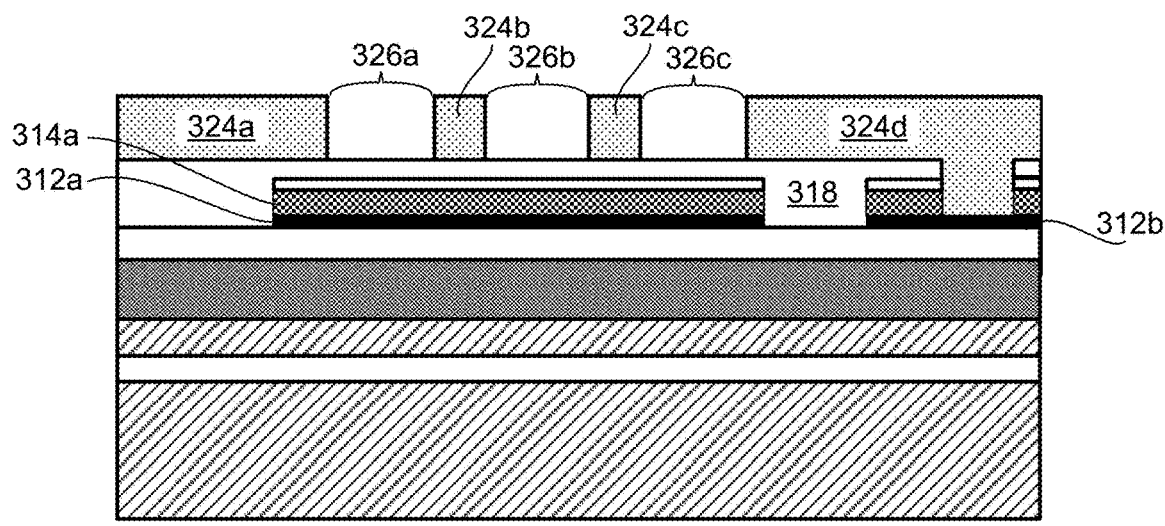
Figure 3K:
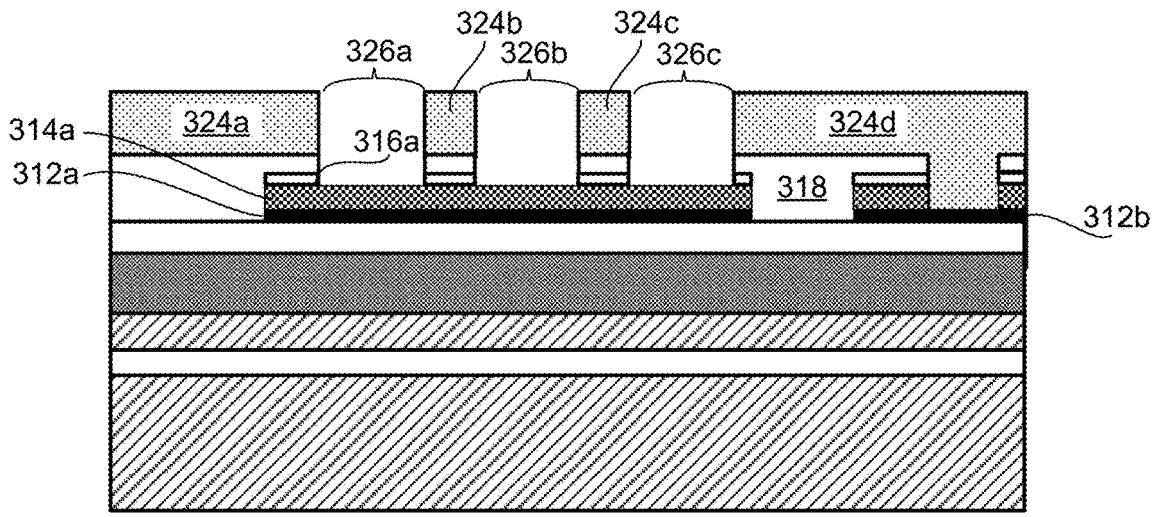
Figure 3L:
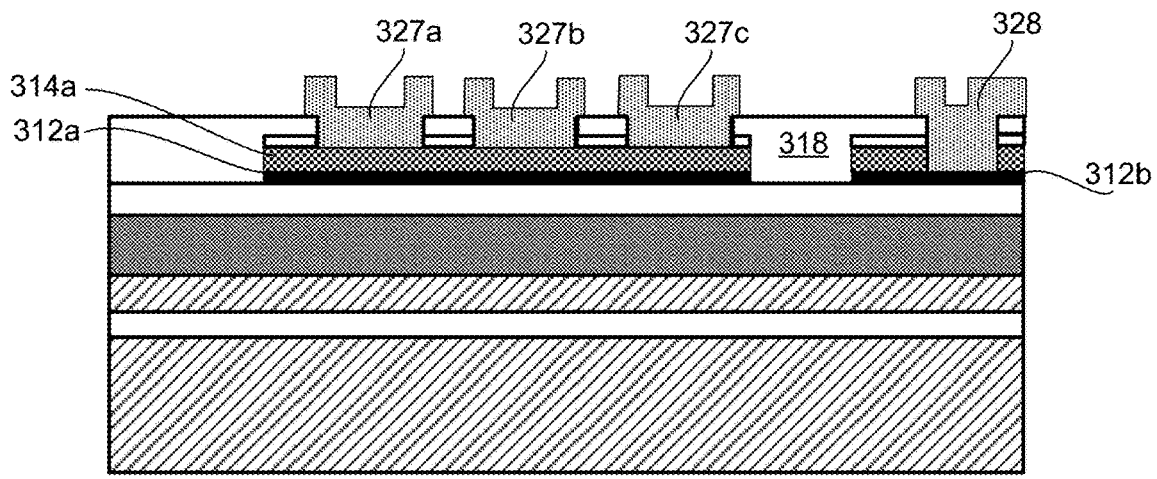
Figure 3M:
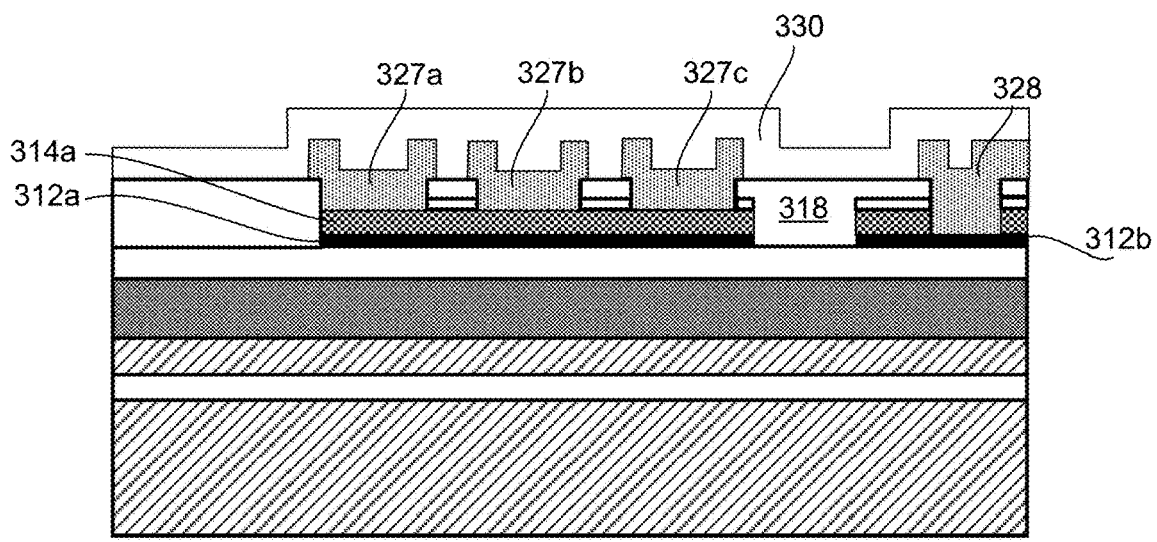
Figure 3N:
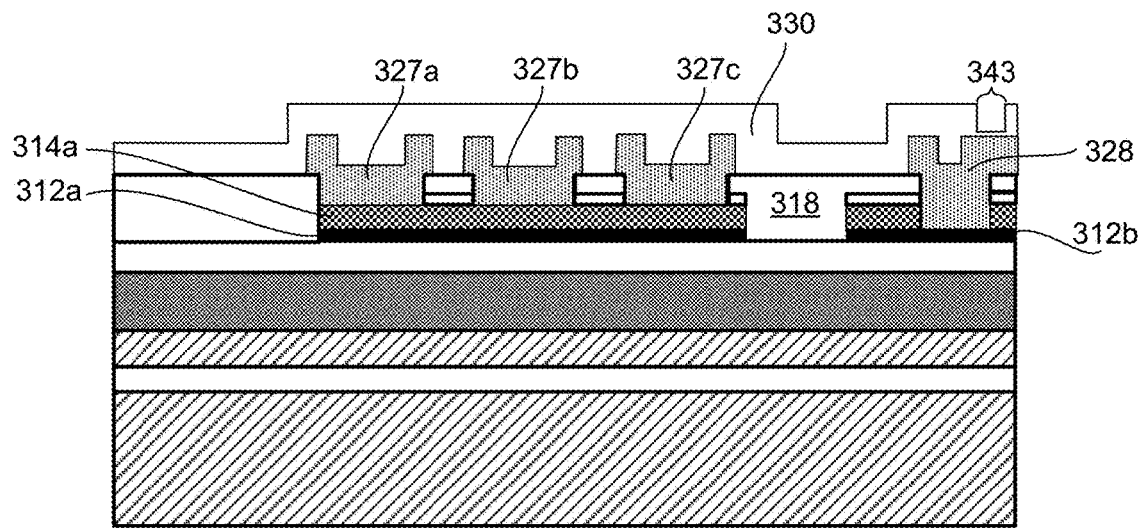
Figure 3O:
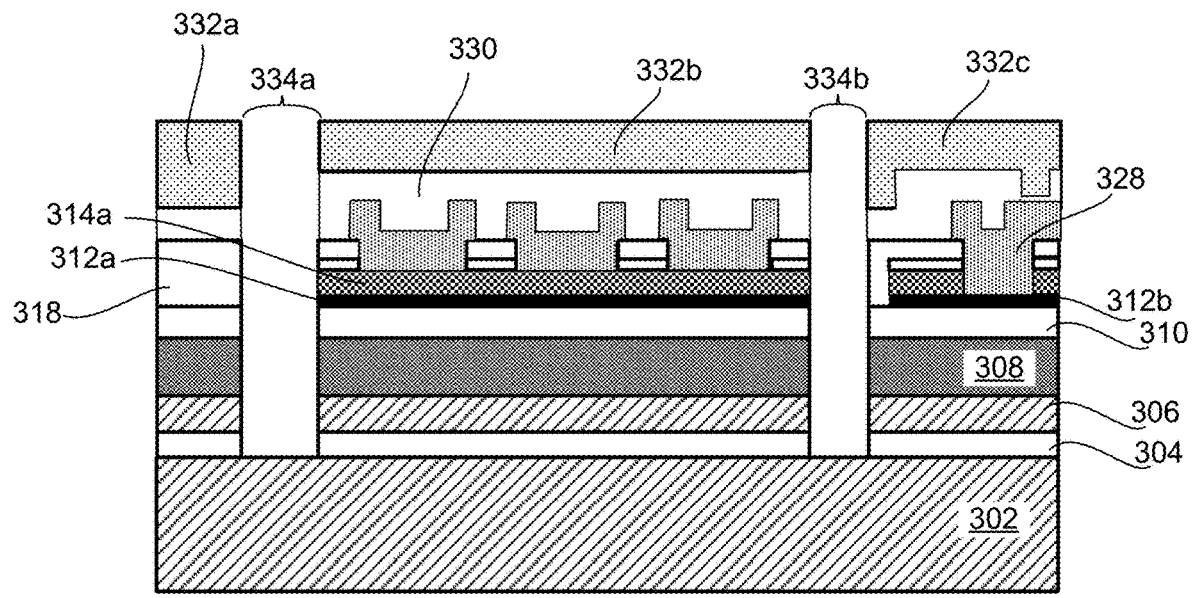
Figure 3P:
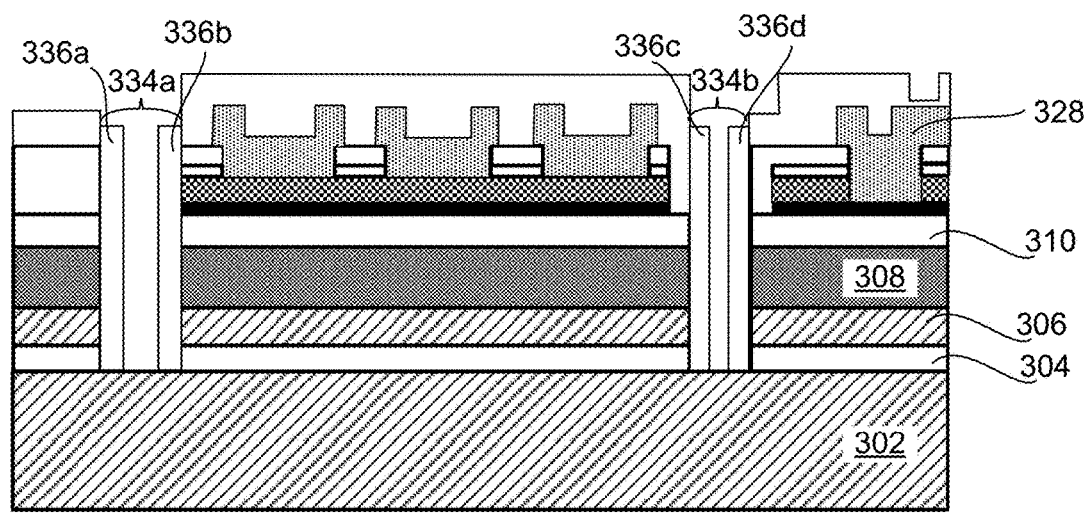
Figure 3Q:
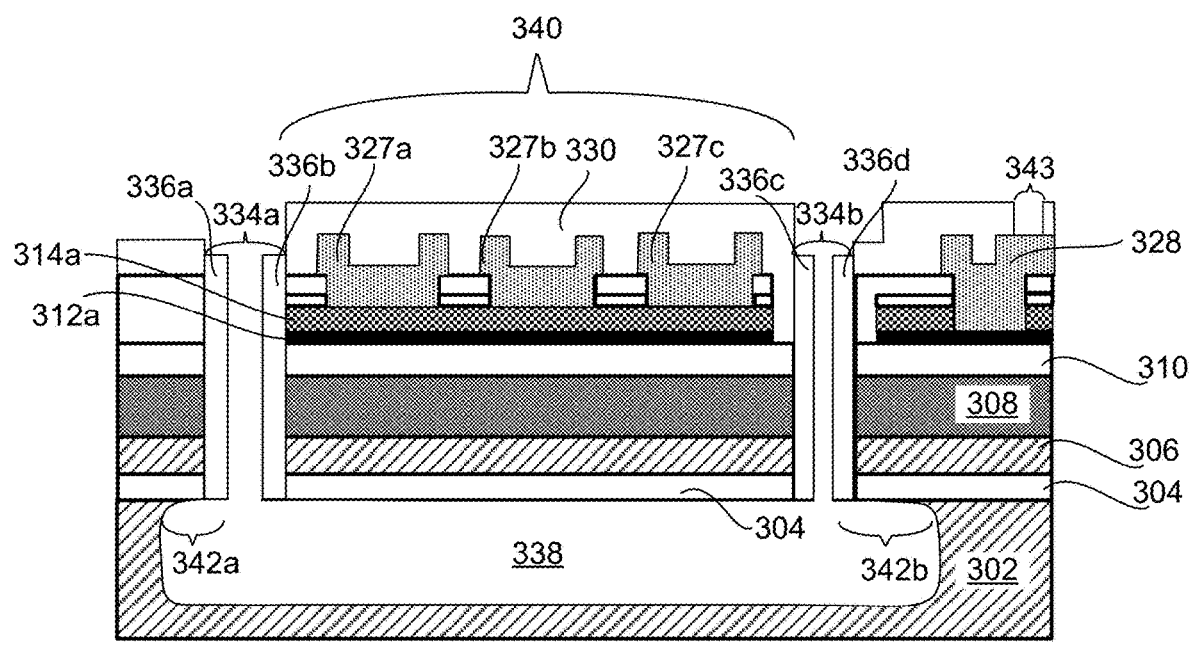

FIGS. 3A-3Q show cross-sectional views of an exemplary method of manufacturing a MEMS device having a suspended structure. FIG. 3A shows layer of epitaxial silicon 308 formed over substrate 300. Substrate 300 has silicon layer 302, insulator layer 304 (e.g., oxide), and silicon layer 306. In some embodiments, substrate 300 is a silicon-on-insulator wafer. Layer of epitaxial silicon 308 may be formed to a desired thickness. Thickness of layer of epitaxial silicon 308 may be in the range of 4 microns to 15 microns, or any value or range of values in that range. In some embodiments, the thickness of epitaxial silicon layer 308 may be reduced from a larger thickness before subsequent fabrication steps, including formation of components over epitaxial silicon layer 308. Silicon layer 306 and epitaxial silicon layer 308 may have a desired combined thickness relative to insulator layer 304. Epitaxial silicon layer 308 may be formed using any suitable type of deposition technique. In some embodiments, the deposition technique used may balance a ratio between oxide thickness and silicon thickness in the resulting MEMS device. The desired ratio between oxide thickness and silicon thickness may vary depending on the types of electrodes used in the suspended MEMS device. The ratio between oxide thickness and silicon thickness may be in the range of 0.4 to 5, or any value or range of values within that range. In embodiments where an electrode of the suspended structure includes aluminum, the ratio between oxide thickness and silicon thickness may be approximately 1.

FIG. 3B shows oxide layer 310 formed over epitaxial silicon layer 308. Oxide layer 310 may be formed using a thermal deposition, or any other suitable deposition technique. The thickness of oxide layer 310 may be in the range of 0.4 microns to 1.5 microns, or any value or range of values in that range.

FIG. 3C shows bottom electrode layer 312 and active layer 314 formed over substrate 300. Bottom electrode layer 312 may be formed in contact with oxide layer 310. Active layer 314 may be formed over bottom electrode layer 312. Bottom electrode layer 312 and active layer 314 may be formed using any suitable deposition techniques. Bottom electrode layer 312 may include one or more metals (e.g., titanium, aluminum, copper, molybdenum, tungsten). Active layer 314 may include one or more piezoelectric materials (e.g., aluminum nitride). The thickness of bottom electrode layer 312 may be in the range of 50 nanometers to 150 nanometers, or any value or range of values in that range. The thickness of active layer 314 may be in the range of 0.2 microns to 1 micron, or any value or range of values in that range.

FIG. 3D shows oxide layer 316 formed over active layer 314. Oxide layer 316 may be formed using any suitable oxide deposition techniques and include one or more oxides. The thickness of oxide layer 316 may be in the range of 10 nanometers to 100 nanometers, or any value or range of values within that range. Oxide layer 316 may act to protect active layer 314 during one or more subsequent steps during fabrication of the MEMS device. In some instances, oxide layer 316 may act to reduce or prevent damage during an etching process applied to active layer 314 and/or bottom electrode layer 312.

FIG. 3E shows patterned active layer regions 314a and 314b, patterned bottom electrode layer regions 312a and 312b, and patterned oxide layer regions 316a and 316b. Although patterning of active layer and bottom electrode layer may include patterning each layer into two regions as shown in FIG. 3E, any suitable number of regions for bottom electrode layer 312 and active layer 314 may be formed. Patterning active layer 314 and bottom electrode layer 312 may include forming regions having any suitable shape and size. Region 314a of active layer and region 312a of bottom electrode layer may form a suspended structure in the resulting MEMS device. Region 314b of active layer and region 312b of bottom electrode layer may form a tether region of the resulting MEMS device. Other elements (e.g., resistive elements, routing elements, contact elements) may be defined at this step in the fabrication process.

FIG. 3F shows oxide layer 318 formed over regions 314a and 314b of active layer and regions 312a and 312b of bottom electrode layer. Any suitable oxide deposition techniques may be used to form oxide layer 318. The thickness of oxide layer 318 may be in the range of 50 nanometers to 350 nanometers, or any value or range of values in that range. Oxide layer 318 may form a planar surface by using any suitable planarization techniques. In some embodiments, formation of oxide layer 318 may include depositing oxide at a suitable thickness to overcome underlying topological features, including varying topology arising from the patterned active layer and bottom electrode layer, and that allows for formation of a planar surface of oxide layer 318 using a planarization technique (e.g., chemical mechanical polishing). In some embodiments, a thickness of oxide layer 318 may be equal to or greater than the combined thickness of bottom electrode layer 312, active layer 314, and oxide layer 316.

FIG. 3G shows formation of resist regions 320a and 320b over planarized oxide layer 318. The thickness of planarized oxide layer 318 over the patterned active layer, such as over active layer region 314a, may be in the range of 50 nanometers to 500 nanometers. Resist regions 320a and 320b form opening 322 over active layer region 314b and bottom electrode region 312b. Opening 322 may be used to form a contact to bottom electrode layer 312b. As shown in FIG. 3H, oxide layers 318 and 316b may be removed in a region that overlaps with opening 322. Oxide layers 318 and 316b may be etched in the region overlapping with opening 322 using any suitable oxide etching process. Active layer 314b may be partially removed in a region that overlaps with opening 322, as shown in FIG. 3H. In some embodiments, a dry etch process may be used to etch active layer 314b partially such that a certain thickness of active layer remains. In some instances, a dry etch process may be non-selective between active layer 314b and bottom electrode layer 312b and etching of the bottom electrode layer may be reduced or removed by performing a multi-step etching process. The multi-step etching process may include using a dry etch process to etch the active layer such that a portion of the active layer remains, as shown in FIG. 3H. The dry etch process can be followed by a wet etch process that selectively etches the remaining portion of the active layer over the material of the bottom electrode layer. In some embodiments, resist regions 320a and 320b may be used during the dry etch process and removed before performing the wet etch process. The resist may be removed using any suitable resist stripping process. In some embodiments, the wet etch process may selectively etch aluminum nitride over a material used in the bottom electrode layer. In some embodiments, the wet etch process may use tetramethylammonium hydroxide (TMAH). FIG. 3I shows contact region 323 of bottom electrode layer 312b formed by etching through active layer 314b to expose a region of bottom electrode layer 312b.

One or more top electrode regions may be formed by removing oxide in one or more regions over the active layer and forming top electrode regions to contact the active layer. FIG. 3J shows formation of resist regions 324a, 324b, 324c, and 324d over oxide layer 318 to form openings 326a, 326b, and 326c positioned over active layer region 314a and bottom electrode layer region 312a. Resist region 324d may contact bottom electrode layer 312b in the region of bottom electrode layer 312b that was exposed during a previous etching process step. One or more regions of oxide over the active layer may be removed in openings 326a, 326b, and 326c between resist regions 324a, 324b, 324c, and 324d. In some embodiments, a dry etch process may be used to selectively etch oxide and leave the active layer. FIG. 3K shows oxide layers 318 and 316a within openings 326a, 326b, and 326c removed to expose active layer 314a.

The resist regions may be removed and one or more top electrode regions may be formed using any suitable deposition process. In some embodiments, a contact for the bottom electrode may be formed during the same stage of the fabrication process as the formation of the one or more top electrode regions. FIG. 3L shows top electrode regions 327a, 327b, and 327c formed over active layer 314a. Top electrode regions 327a, 327b, and 327c are in contact with active layer 314a. Top electrode regions 327a, 327b, and 327c may include one or more conductive materials (e.g., aluminum, copper, titanium, molybdenum). The thickness of top electrode regions 327a, 327b, and 327c may be in a range of 400 nanometers to 1.2 microns, or any value or range of values within that range. Top electrode regions 327a, 327b, and 327c may be sized and shaped to have one or more desired dimensions. Although three top electrode regions are shown in FIG. 3L, it should be appreciated that any number of top electrode regions may be formed according to the techniques described herein. FIG. 3L also shows formation of contact 328 for bottom electrode region 312b, which may act as a bond pad for the bottom electrode in the resulting structure. Contact 328 may be deposited in the same fabrication step as top electrode regions 327a, 327b, and 327c. Contact 328 may include one or more conductive materials (e.g., aluminum, copper, titanium). The thickness of contact 328 may be in the range of 400 nanometers to 1.2 microns, or any value or range of values within that range.

One or more layers of spacer material (e.g., oxide) may be formed over one or more top electrode regions. FIG. 3M shows formation of oxide layer 330 over top electrode regions 327a, 327b, and 327c and contact 328. A region of oxide layer 330 over contact 328 may be removed using a suitable oxide etching process. In some embodiments, the oxide layer 330 in that region may be removed partially such that a thinner layer of oxide remains over contact 328. Having a layer of oxide over contact 328 may improve formation of a cavity in substrate 300. Keeping a thin layer of oxide over contact 328 intact may reduce or remove resist from entering into the cavity. FIG. 3N shows region 343 of oxide layer 330 partially removed such that a thin layer of oxide is over contact 328.

One or more channels may be formed by forming one or more resist regions on a surface opposite the substrate and removing layers of oxide and/or silicon to expose the underlying substrate. The one or more channels may be formed in regions of the surface that are non-overlapping with the patterned active layer and the bottom electrode layer. FIG. 3O shows resist regions 332a, 332b, and 332c formed over oxide layer 330 and channels 334a and 334b formed by removing oxide layers 330, 318, and 310, insulator layer 304, and silicon layers 308 and 306. Formation of channels 334a and 334b may be formed using any suitable etching process and with any suitable number of etching steps. In some embodiments, formation of channels 334a and 334b may include a first oxide etch process, a silicon etch process, and a second oxide etch process. These three etch process steps may each use the same resist regions 332a, 332b, and 332c. The first oxide etch process may etch through oxide layers 330, 318, and 310. The silicon etch process may etch through epitaxial silicon layer 308 and silicon layer 306. The second oxide etch process may etch through insulator layer 304 to expose silicon layer 302 of substrate 300. One or more oxide and/or silicon etch processes may include the use of xenon difluoride ($XeF_2$).

A layer of spacer material may be formed on sidewalls of the one or more channels. The layer of spacer material may include one or more oxides, or any other suitable material. In some embodiments, the layer of spacer material may be formed on the sidewalls of the one or more channels and over a silicon layer of the substrate. Oxide over the silicon layer of the substrate may be removed using a suitable etching process to expose the silicon layer before forming a cavity in the silicon layer. The layer of spacer material may act to protect one or more layers, including a silicon layer, the active layer, the bottom electrode, and/or the top electrode, during formation of a cavity in the underlying substrate. FIG. 3P shows spacer layers 336a and 336b formed on the sides of channel 334a and spacer layers 336c and 336d formed on the sides of channel 334b. Resist regions 332a, 332b, and 332c have been removed. Any suitable complementary metal-oxide-semiconductor (CMOS) processing techniques may be used to form spacer layers 336a, 336b, 336c, and 336d. Spacer layers 336a, 336b, 336c, and 336d may be formed in a manner that allows for conformal deposition of material along the sides of channels 334a and 334b. In embodiments where a layer of spacer material is formed over silicon layer 302, the layer of spacer material may be removed using a dry etch process that leaves the layer of spacer material along the sidewalls of channels 334a and 334b, as shown in FIG. 3P.

The one or more channels may be positioned to allow for removal of a portion of the substrate underneath the patterned active layer and bottom electrode to form a cavity. The cavity may be formed using any suitable isotropic etch process that etches both vertically and laterally. In some embodiments, an isotropic silicon dry etch process may be used to form the cavity in a silicon substrate. Vapors used during the silicon dry etch process may include xenon difluoride ($XeF_2$) and/or sulfur hexafluoride ($SF_6$). FIG. 3Q shows cavity 338 formed in silicon layer 302 underneath resonator structure 340. Cavity 338 extends beyond channels 334a and 334b to form undercut regions 342a and 342b. Cavity 338 has rounded corners. Both undercut regions 342a and 342b and rounded corners may be formed as a result of the isotropic etching process used to form cavity 338. Additional processing of the resulting MEMS device may include formation of one or more contacts. As shown in FIG. 3Q, an oxide etch process may be used to remove oxide layer 330 in region 343 to expose contact 328. The resulting suspended structure may be enclosed by one or more spacer materials in a cross-sectional plane of the MEMS device. As shown in FIG. 3Q, insulator layer 304, oxide layer 330, and spacer layers 336b and 336c enclose resonator structure 340 having top electrode regions 327a, 327b, and 327c, active layer 314a, and bottom electrode layer 312a in the plane shown in FIG. 3Q.

In some embodiments, a cavity for a suspended microelectromechanical systems (MEMS) device may be confined to desired dimensions or contours within a substrate. In some such embodiments, the confinement may be provided by one or more trenches that extend towards and within the substrate of the device, and which in some embodiments are filled with a material resistant to the etching process used to form the cavity in the substrate. For example, in some embodiments one or more trenches formed in a substrate may confine the extent to which the cavity extends horizontally during an isotropic etch process. In this manner, the one or more trenches may allow for formation of a structure suspended over a cavity with one or more laterally defined dimensions. In some embodiments, the one or more trenches may reduce or prevent the formation of undercut regions during formation of a cavity.

Depending on the type of MEMS device, a cavity confined by one or more trenches may provide desired performance characteristics of the MEMS device, for example by providing a known volume of vacuum or pressurized space in the vicinity of a moving component of the MEMS device. In some embodiments, the one or more trenches may enclose a circumference of the cavity to form a closed contour. The resulting cavity may have a more rectangular cross-sectional shape than a cavity formed without the one or more trenches. In some embodiments, a cavity defined by one or more trenches may have square corners.

The one or more trenches may be formed of any suitable material. In some embodiments, a trench may include one or more oxides. The trench formed of one or more oxides in a silicon substrate may reduce or prevent the formation of undercut regions during etching of the silicon substrate to form a cavity in the substrate. In some instances, a trench formed of one or more oxides may be undesired because some oxides may have material limitations (e.g., tensile stress) that can impact the quality and/or performance of the trench. Some embodiments may have a trench lined with one or more oxides and filled with a suitable filler material (e.g., polysilicon). The oxide may serve to resist etching during formation of the cavity underlying a suspended MEMS device, and the filler material may be provided to reduce material stresses.

Figure 4:
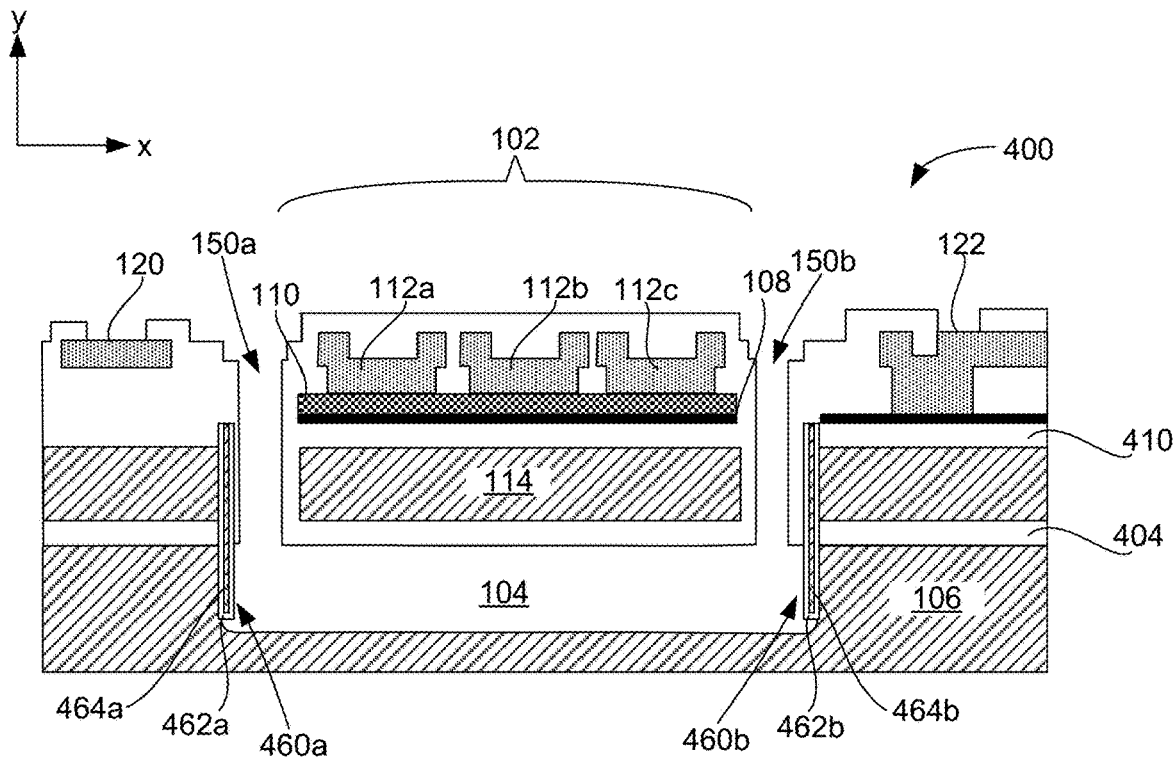
FIG. 4 is a cross-sectional view of a microelectromechanical systems device having a suspended resonator structure.

FIG. 4 shows an example of MEMS device 400 that includes trenches 460a and 460b. In some embodiments, trenches 460a and 460b may physically connect (into and/or out of the view shown in FIG. 4) to form a single trench that surrounds all or part of resonator structure 102, such as enclosing the cavity 104. Trenches 460a and 460b may extend across one or more layers of oxide and/or silicon of the device. As shown in FIG. 4, trenches 460a and 460b extend from bottom electrode layer 108, across oxide layers 410 and 404, across silicon layer 114, and into substrate 106. Trenches 460a and 460b may include one or more oxides and/or silicon. As shown in FIG. 4, trench 460a is lined with oxide 462a and filled with silicon 464a. Likewise, trench 460b is lined with oxide 462b and filled with silicon 464b. The oxide liners 462a and 462b may resist etching during formation of the cavity 104. The silicon 464a and 464b may reduce stresses which would result from completely filling the trenches 460a and 460b with oxide. A trench may have any suitable dimensions and/or aspect ratio. A width of a trench, corresponding to the x-dimension of trenches 460a and 460b shown in FIG. 4, may be in the range of 0.5 microns to 5 microns, or any value or range of values within that range. A depth of a trench, corresponding to the y-dimension of trenches 460a and 460b shown in FIG. 4, may be in the range of 15 microns to 50 microns, or any value or range of values within that range. The thickness of the oxide 462a and 462b may have any suitable value to withstand the etch used to form cavity 104.

Formation of a cavity defined by one or more trenches, as shown in FIG. 4, may include forming the one or more trenches at any suitable stage in the fabrication process prior to formation of the cavity. In some embodiments, one or more trenches may be formed after formation of a bottom electrode layer, which may form a bottom electrode in the resulting device. In some embodiments, formation of one or more trenches may occur after formation of a bottom electrode layer and before formation of an active layer. For example, method 200 shown in FIG. 2 may include an additional act between act 210 of forming the bottom electrode layer and act 220 of forming the active layer where the additional act includes forming one or more trenches. With respect to FIG. 3C, one or more trenches may be formed after formation of bottom electrode layer 312 and before formation of active layer 314. Formation of one or more trenches may include a multi-step etch process to etch through one or more layers of oxide (e.g., oxide layer 310 and insulator layer 304) and/or one or more layers of silicon (e.g., silicon layers 302, 306, 308). In some embodiments, formation of one or more trenches may include a first silicon etch process, followed by an oxide etch process, followed by a second silicon etch process. In the context of FIG. 3C, the first silicon etch process may be used to etch through silicon layers 306 and 308, the oxide etch process may be used to etch through insulator layer 304, and the second silicon etch process may be used to etch into silicon layer 302. The second silicon etch process may be a timed etch process to allow for formation of a trench having a desired depth. An etched region may be filled with one or more oxides and/or silicon. In some embodiments, an etched region may be lined with one or more oxides and filled with polysilicon. One or more additional layers of the device may be formed over the one or more trenches. One or more channels formed to extend to the underlying substrate may be positioned between the resonator structure and the one or more trenches and used to etch a portion of the underlying substrate to form a cavity defined by the one or more trenches.

Figure 5:
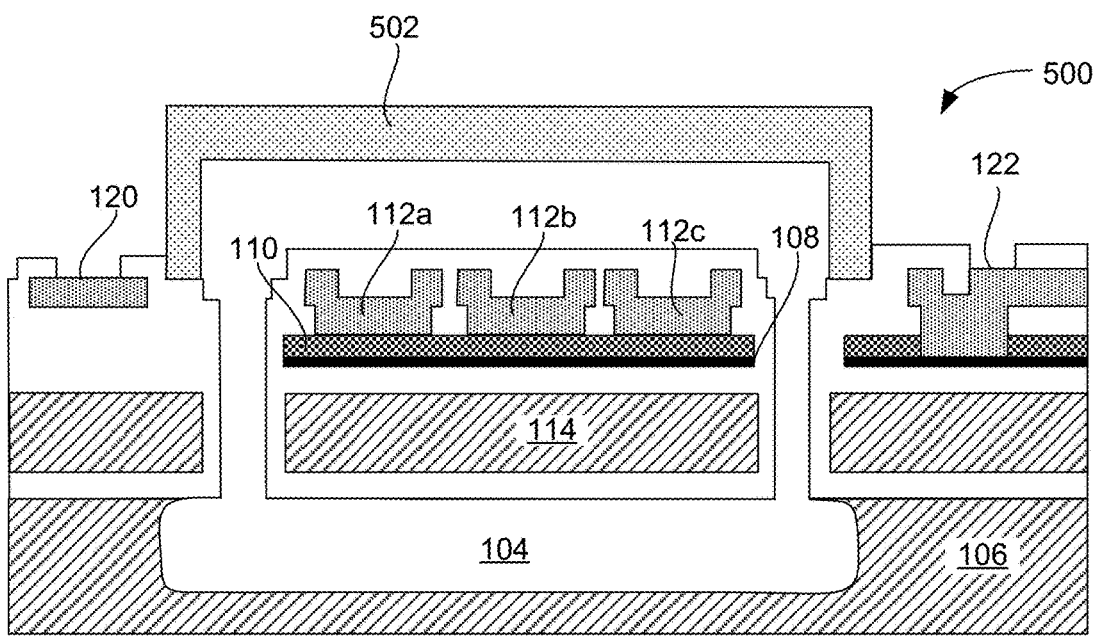
FIG. 5 is a cross-sectional view of a microelectromechanical systems device that includes a cap.

In some embodiments, MEMS devices of the types described herein may include a cap. For example, a dummy cap, or a cap with integrated circuitry may be used to cap a suspended structure of a MEMS device. FIG. 5 shows an example of MEMS device 500 that includes a resonator structure and cap 502. The cap may be formed of any suitable material, and may be bonded with the structure of MEMS device 500 using glass frit or any other suitable bonding technology. The cap may be used to maintain a desired pressure (e.g., vacuum) for the suspended structure.

The suspended MEMS devices described herein may be used in various applications and for fabrication of different types of devices that have a structure suspended over a cavity. MEMS devices that may be formed according to the techniques described herein may be applied to the fabrication of resonator MEMS devices, accelerometer MEMS devices, and gyroscope MEMS devices. For example, resonator MEMS devices may be used in frequency sensing applications including gas sensors, humidity sensors, and pressure sensors. The frequency at which the resonator structure resonates may vary depending on the surrounding environmental conditions. In a gas sensor, gas molecules may interact with a surface and the resonator may detect a frequency indicative of the presence of the gas molecules. As another example, resonator MEMS devices may be used in timing applications. For instance, the frequency that the resonator resonates may be used as clock signal, which may be used in the timing of another device or component.

Other uses of the suspended MEMS devices described herein are also possible, as the examples described are non-limiting.

As described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A microelectromechanical systems (MEMS) device comprising:
    a bottom electrode positioned over a cavity of a silicon substrate;
    a top electrode;
    an active layer positioned between the bottom electrode and the top electrode, wherein the top electrode has regions in contact with a surface of the active layer;
    spacer material contacting the surface of the active layer between the regions of the top electrode, wherein the regions of the top electrode have overhang portions adjacent a top surface of portions of the spacer material; and
    at least one channel extending from a surface of the microelectromechanical device to the cavity, wherein one or more sidewalls of the at least one channel include a sidewall spacer.

2. The MEMS device of claim 1, wherein the bottom electrode, the top electrode, and the active layer are enclosed by at least one spacer material in at least one cross-sectional plane of the microelectromechanical device.

3. The MEMS device of claim 1, wherein the spacer material contacting the surface of the active layer includes a portion positioned over the regions of the top electrode and in contact with the top electrode.

4. The MEMS device of claim 3, wherein the spacer material contacting the surface of the active layer is configured to provide thermal compensation for the MEMS device.

5. The MEMS device of claim 1, wherein the cavity extends from underneath the bottom electrode beyond the at least one channel.

6. The MEMS device of claim 5, wherein the cavity has rounded corners.

7. The MEMS device of claim 1, further comprising:
at least one silicon layer positioned between the bottom electrode and the cavity; and
a spacer layer positioned between the bottom electrode and the at least one silicon layer.

8. The MEMS device of claim 1, wherein the bottom electrode and the top electrode are in contact with the active layer.

9. The MEMS device of claim 1, wherein:
the bottom electrode, the active layer, and the top electrode form a resonator region of the MEMS device,
the MEMS device further is comprised of a tether region separate from the resonator region, and
the tether region is comprised of at least one oxide layer positioned between a layer of active material and a contact, wherein the layer of active material and the active layer of the resonator region are coplanar.

10. The MEMS device of claim 9, wherein the contact is a contact of the bottom electrode.

11. The MEMS device of claim 1, wherein the MEMS device further comprises at least one trench that extends into the silicon substrate, and the cavity extends to the at least one trench.

12. A method for forming a microelectromechanical systems (MEMS) device comprising:
forming an electrode layer over a silicon substrate;
forming an active layer over the electrode layer;
patterning the electrode layer and the active layer to form a bottom electrode and an active region;
forming a spacer layer over the active region and patterning the spacer layer to form a plurality of portions;
forming a top electrode over the active region and the portions of the spacer layer, wherein:
the active region is positioned between the bottom electrode and the top electrode,
the top electrode includes a plurality of regions separated from each other by the portions of the spacer layer, and
the regions of the top electrode have overhang portions adjacent a top surface of at least one of the portions of the spacer layer; and
forming a cavity in the silicon substrate by:
forming at least one channel that extends from a surface to the silicon substrate, and
laterally etching at least a portion of the silicon substrate under the bottom electrode.

13. The method of claim 12, further comprising:
forming a layer of epitaxial silicon on a surface of the silicon substrate and forming an oxide layer over the layer of epitaxial silicon, wherein the electrode layer is formed to be in contact with the oxide layer.

14. The method of claim 12, further comprising:
forming a layer of spacer material over the top electrode, wherein the layer of spacer material is in contact with the top electrode and is configured to provide thermal compensation to the top electrode.

15. The method of claim 12, wherein the cavity extends from underneath the bottom electrode beyond the at least one channel and has rounded corners.

16. The method of claim 12, wherein:
the silicon substrate is a silicon-on-insulator substrate, and
the forming of the at least one channel is comprised of forming the at least one channel to extend to an insulator layer of the silicon-on-insulator substrate.

17. A method for forming a microelectromechanical systems (MEMS) device comprising:
forming a bottom electrode and an active layer over a silicon substrate;
forming spacer material in contact with a surface of the active layer, wherein the spacer material includes a plurality of portions in contact with the surface of the active layer, and wherein the surface of the active layer includes exposed regions adjacent regions in contact with the portions of the spacer material;
forming a top electrode to include a plurality of regions that contact the exposed regions of the active layer, wherein the regions of the top electrode have side portions adjacent side surfaces of the portions of the spacer material and overhang portions adjacent top surfaces of the portions of the spacer material;
forming at least one channel that extends to the silicon substrate;
forming a spacer on a surface of the at least one channel; and
forming a cavity underneath the bottom electrode by laterally etching a portion of the silicon substrate under the bottom electrode.

18. The method of claim 17, further comprising:
forming a layer of epitaxial silicon on a surface of the silicon substrate and forming an oxide layer over the layer of epitaxial silicon, wherein the bottom electrode is formed to be in contact with the oxide layer.

19. The method of claim 17, further comprising:
forming a spacer layer over the top electrode, wherein the spacer layer is in contact with the top electrode and is configured to provide thermal compensation to the top electrode.

20. The method of claim 17, wherein the cavity extends from underneath the bottom electrode beyond the at least one channel and has rounded corners.

* * * * *